US009386374B2

(12) United States Patent
Wei

(10) Patent No.: US 9,386,374 B2
(45) Date of Patent: Jul. 5, 2016

(54) APPARATUS AND METHOD FOR KEEPING OUTPUT LOUDNESS AND QUALITY OF SOUND AMONG DIFFERENT EQUALIZER MODES

(71) Applicant: Samsung Electronics Co., Ltd., Gyeonggi-do (KR)

(72) Inventor: Junfeng Wei, Guangdong Province (CN)

(73) Assignee: Samsung Electronics Co., Ltd., Suwon-si (KR)

( * ) Notice: Subject to any disclaimer, the term of this patent is extended or adjusted under 35 U.S.C. 154(b) by 324 days.

(21) Appl. No.: 14/067,692

(22) Filed: Oct. 30, 2013

(65) Prior Publication Data

US 2014/0119546 A1 May 1, 2014

(30) Foreign Application Priority Data

Oct. 30, 2012 (CN) .......................... 2012 1 0424656
Apr. 29, 2013 (KR) ........................ 10-2013-0047357

(51) Int. Cl.
*H03G 11/00* (2006.01)
*H04R 3/04* (2006.01)
*H04R 3/00* (2006.01)

(52) U.S. Cl.
CPC .................. *H04R 3/04* (2013.01); *H04R 3/007* (2013.01); *H04R 2430/01* (2013.01); *H04R 2430/03* (2013.01)

(58) Field of Classification Search
CPC ........ H04R 3/007; H04R 5/027; H04R 3/002; H04R 2430/03; H04R 3/04; H04R 25/407; H03G 5/165; H03G 3/32; H04N 11/00
USPC ............ 379/55, 103, 26, 61, 57, 56, 106, 109
See application file for complete search history.

(56) References Cited

U.S. PATENT DOCUMENTS

2002/0159607 A1* 10/2002 Ford ....................... H03G 5/005 381/103
2002/0167354 A1* 11/2002 Stanley ................ H03F 3/2175 330/10
2008/0144861 A1* 6/2008 Melanson .............. H03F 1/025 381/120

* cited by examiner

*Primary Examiner* — Akelaw Teshale

(57) ABSTRACT

An apparatus and method for keeping output loudness and quality of sound in different equalizer modes. The apparatus includes a gain setting unit configured to set a protection limit of an output voltage of an input audio signal; an equalizer (EQ) mode filter configured to filter the input audio signal so as to achieve the different equalizer modes; an amplitude real-time processing module configured to receive the audio signal output from the EQ mode filter or an audio signal feedback, and process the received audio signal such that the output voltage of the processed audio signal is lower than the protection limit; and a digital-to-analog converter configured to perform a digital-to-analog conversion on the processed audio signal, and output an analog audio signal.

14 Claims, 7 Drawing Sheets

APPARATUS AND METHOD FOR KEEPING OUTPUT LOUDNESS AND QUALITY OF SOUND AMONG DIFFERENT EQUALIZER MODES

CROSS-REFERENCE TO RELATED APPLICATION(S) AND CLAIM OF PRIORITY

The present application is related to and claims the benefit under 35 U.S.C. §119(a) a Chinese patent application filed on Oct. 30, 2012 in the State Intellectual Property Office and assigned Serial No. 201210424656.7 and of a Korean patent application filed on Apr. 29, 2013 in the Korean Intellectual Property Office and assigned Serial No. 10-2013-0047357, the entire disclosure of which is hereby incorporated by reference.

TECHNICAL FIELD OF THE INVENTION

The present disclosure relates to audio signal processing, and more particularly, to an apparatus and method for keeping output loudness and quality of sound in different equalizer modes by performing ear perception dynamic processing on a frequency band in which the equalizer mode is enhanced under a maximum volume.

BACKGROUND OF THE INVENTION

With a development of technologies, more mobile terminals (e.g., a mobile phone) have a music playing function besides a traditional audio playing apparatus. When playing music, different equalizer modes (e.g. normal, classical, pop, country, rock, etc.) are achieved by performing an amplitude amplification or attenuation on the original sound signal in certain frequency bands. Usually, configuration schemes of the different equalizer modes are obtained by measuring a frequency response curve.

When listening to music under a condition that the external environment is noisy, a user generally increases the volume to clearly hearing the music. Usually, the volume can be increased by increasing output magnification of a power amplifier. However, whether it is a speaker or an earphone, a voltage which exceeds a rated power may cause a burn out of a sound device due to overheating. Also, hearing an excessive volume for an extended time will gradually damage a user's hearing. In order to protect the user's hearing, and prevent damage of the sound device, it may be necessary to manage RMS voltage or sound pressure level when the sound device operates under the maximum volume, so that the RMS voltage or sound pressure level is lower than a specific limit (hereinafter referred to as a protection limit).

Commonly, in a case where the equalizer mode is turned off, the frequency response curve in the working band is planar. However, for other modes, the frequency response curve may have a variance of −6 dB to +6 dB relative to equalize OFF or NORMAL mode. There are several methods for avoiding the output exceeding the protection limit. One method sets a gain in the maximum volume in accordance with the situation in which the equalizer mode is turned off (i.e., an equalizer curve is planar), so that an output is lower than the protection limit. However, since equalizer curves of some equalizer modes are higher than the planar equalizer curve, it is possible that the output voltage still exceeds the protection limit. A second method whose set manner is the same as that of the first method but lowers the protection limit by −6 dB ensures the output is lower than the protection limit. As such, the volume in any equalizer mode will be lower than the volume in which the equalizer mode is turned off, thus the same SNR (Signal to Noise Ratio) cannot be achieved under a noisy environment, and the equal quality of sound cannot be obtained. A third method whose set manner is same as that of the first method in the situation in which the equalizer mode is turned off, while lowering the protection limit by −6 dB when the equalizer mode is turned on. The method ensures the output is lower than the protection limit, while it may cause a jump of the volume when switching the equalizer mode on or off.

In addition, the three methods described above cannot ensure that the output is lower than the protection limit when a sound field mode (such as an echo enhancement, a 3D sound effect) is used. FIGS. 1A to 1C illustrate the frequency response curves in the above three methods.

SUMMARY OF THE INVENTION

To address the above-discussed deficiencies of the prior art, it is a primary object to provide an audio processing apparatus and method which can automatically lower amplitude of an output in a case where the output exceeds a protection limit, achieve proper output loudness in hearing, and ensure quality of sound under a noisy environment, regardless of whether an equalizer mode is turned on or turned off.

According to an aspect of the present disclosure, an apparatus for keeping output loudness and quality of sound in different equalizer modes is provided. The apparatus includes a gain setting unit configured to set a protection limit of an output voltage of an input audio signal; an equalizer (EQ) mode filter configured to filter the input audio signal so as to achieve the different equalizer modes; an amplitude real-time processing module configured to receive the audio signal output from the EQ mode filter or an audio signal feedback, and process the received audio signal to achieve the output voltage of the processed audio signal lower than the protection limit; and a digital-to-analog converter configured to perform a digital-to-analog conversion on the processed audio signal and output an analog audio signal.

The amplitude real-time processing module may include an amplitude detecting module configured to detect an RMS voltage of the received audio signal; and a psychoacoustics amplitude processing module configured to selectively perform at least one of the following processes: a signal straight through processing, a harmonic extraction processing, and an attenuation protection processing, on the received audio signal according to the detected RMS voltage of the audio signal, so that the output voltage of the processed audio signal is lower the protection limit.

The psychoacoustics amplitude processing module may include an amplitude and frequency domain analyzing module configured to analyze the received audio signal according to the RMS voltage of the audio signal detected by the amplitude detecting module, so as to determine a frequency band on which energy concentrates; a band-stop filter configured to attenuate a specific frequency band of the received audio signal; a first band pass filter configured to pass the specific frequency band of the received audio signal; a pre-distortion module configured to generate harmonic components of the audio signal output from the first band pass filter; a second band pass filter bank configured to extract second and third harmonics of the audio signal output from the first band pass filter; and a mixer configured to superpose the audio signal output from the band-stop filter and the audio signal output from the second band pass filter bank, and output the superposed audio signal.

The second band pass filter bank may include a second band pass filter configured to extract the second harmonics of the audio signal output from the first band pass filter and a third band pass filter configured to extract the third harmonics of the audio signal output from the first band pass filter.

When the amplitude and frequency domain analyzing module determines that the RMS voltage of the audio signal detected by the amplitude detecting module is higher than the protection limit, the amplitude and frequency domain analyzing module may analyze the audio signal output from the EQ mode filter to determine the frequency band on which the energy concentrates, set the bandwidths of the band-stop filter, the first band pass filter, and the second band pass filter bank to be the bandwidth of the frequency band on which the energy concentrates, such that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing by the psychoacoustics amplitude processing module.

After the psychoacoustics amplitude processing module performs the harmonics extraction processing, the amplitude detecting module may detect the RMS voltage of the audio signal on which the harmonics extraction processing has been performed, and feed back the audio signal on which the harmonics extraction processing has been performed to the psychoacoustics amplitude processing module.

When the amplitude and frequency domain analyzing module determines that the RMS voltage of audio signal on which the harmonics extraction processing has been performed, detected by the amplitude detecting module, is higher than the protection limit, the amplitude and frequency domain analyzing module may analyze the feedback audio signal on which the harmonics extraction processing has been performed to determine a frequency band on which energy concentrates again, and set the bandwidths of the band-stop filter, the first band pass filter and the second band pass filter bank to be the bandwidth of the frequency band on which the energy concentrates, so that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing by the psychoacoustics amplitude processing module again.

After the psychoacoustics amplitude processing module performs the harmonics extraction processing again, the amplitude detecting module may detect the RMS voltage of the audio signal on which the harmonics extraction processing has been performed again.

When the amplitude detecting module detects that the RMS voltage of the audio signal on which the harmonics extraction processing has been performed again is higher than the protection limit, the amplitude detecting module may determine an attenuation gain according to the RMS voltage of the audio signal detected before the harmonics extraction processing is performed by the psychoacoustics amplitude processing module and the protection limit.

When the amplitude and frequency domain analyzing module receives the attenuation gain determined by the amplitude detecting module, the amplitude and frequency domain analyzing module may set gains of the first band pass filter and the second band pass filter bank to be infinitesimal, set a gain of the band-stop filter to be the attenuation gain, and allow the audio signal output from the EQ mode filter to pass the first band pass filter in full frequency band, thereby performing the attenuation protection processing by the psychoacoustics amplitude processing module.

When the amplitude and frequency domain analyzing module determines that the RMS voltage of the audio signal detected by the amplitude detecting module is lower than the protection limit, the amplitude and frequency domain analyzing module may set the gains of the first band pass filter and the second band pass filter bank to be infinitesimal, set the gain of the band-stop filter as 0 dB, and allow the audio signal output from the EQ mode filter to pass the band-stop filter in full frequency band, thereby performing the signal straight through processing by the psychoacoustics amplitude processing module.

According to another aspect of the present disclosure, a method for keeping output loudness and quality of sound indifferent equalizer modes is provided. The method includes the following operations: (a) setting a protection limit of an output voltage of an input audio signal; (b) filtering the input audio signal so as to achieve the different equalizer modes; (c) processing a received audio signal so that the output voltage of the processed audio signal is lower than the protection limit; and (d) performing a digital-to-analog conversion on the processed audio signal, and outputting an analog audio signal, wherein the processed audio signal is feedback, such that the received audio signal is the filtered audio signal or the feedback processed audio signal in operation (c).

Operation (c) may include detecting an RMS voltage of the received audio signal; and selectively performing at least one of the following 3 processes: a signal straight through processing, a harmonic extraction processing and an attenuation protection processing on the received audio signal according to the detected RMS voltage of the audio signal, such that the output voltage of the processed audio signal is lower the protection limit.

Operation (c) may further include analyzing the received audio signal according to the RMS voltage of the audio signal detected by the amplitude detecting module, so as to determine a frequency band on which energy concentrates; attenuating a specific frequency band of the received audio signal by a band-stop filter; passing the specific frequency band of the received audio signal through a first band pass filter; generating harmonic components of the audio signal output from the first band pass filter; extracting second and third harmonics of the audio signal output from the first band pass filter by a second band pass filter bank; superposing the audio signal output from the band-stop filter and the audio signal output from the second band pass filter bank, and outputting the superposed audio signal by a mixer.

The second band pass filter bank may include a second band pass filter for extracting the second harmonics of the audio signal output from the first band pass filter and a third band pass filter for extracting the third harmonics of the audio signal output from the first band pass filter.

In operation (c), when the detected RMS voltage of the audio signal is higher than the protection limit, the filtered audio signal may be analyzed so as to determine the frequency band on which the energy concentrates, the bandwidths of the band-stop filter, the first band pass filter, and the second band pass filter bank can be set to be the bandwidth of the frequency band on which the energy concentrates, so that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing by the psychoacoustics amplitude processing module.

In operation (c), when the detected RMS voltage of audio signal on which the harmonics extraction processing has been performed is higher than the protection limit, the feedback audio signal on which the harmonics extraction processing has been performed may be analyzed so as to determine a frequency band on which energy concentrates again, and the bandwidths of the band-stop filter, the first band pass filter, and the second band pass filter bank can be set to be the bandwidth of the frequency band on which the energy concentrates, so that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing again.

In operation (c), when the detected RMS voltage of audio signal on which the harmonics extraction processing has been performed again is higher than the protection limit, gains of the first band pass filter and the second band pass filter bank may be set as infinitesimal, a gain of the band-stop filter may be set as an attenuation gain, and the filtered audio signal output may be allowed to pass the first band pass filter in full frequency band, thereby performing the attenuation protection processing, wherein the attenuation gain is determined according to the RMS voltage of the audio signal detected before the harmonics extraction processing is performed by the psychoacoustics amplitude processing module and the protection limit.

In operation (c), when the detected RMS voltage of the audio signal is lower than the protection limit, the gains of the first band pass filter and the second band pass filter bank may be set as infinitesimal, the gain of the band-stop filter may be set as 0 dB, and the filtered audio signal may be allowed to pass the band-stop filter in full frequency band, thereby performing the signal straight through processing.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF TEE DRAWINGS

For a more complete understanding of the present disclosure and its advantages, reference is now made to the following description taken in conjunction with the accompanying drawings, in which like reference numerals represent like parts:

DETAILED DESCRIPTION OF THE INVENTION

Figure 1A:
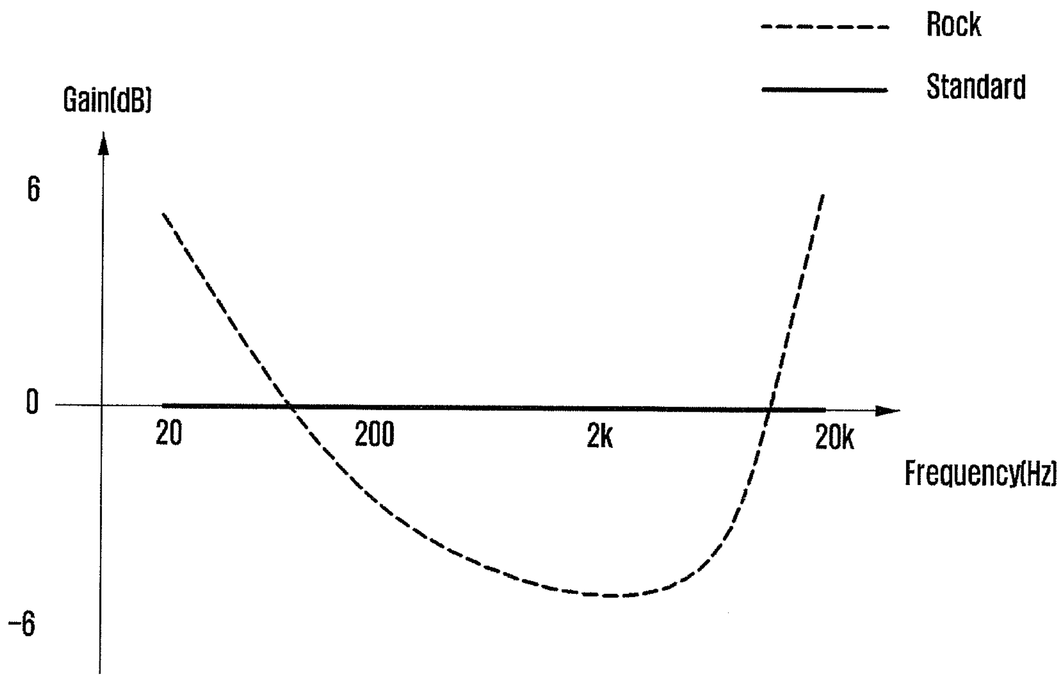
FIGS. 1A to 1C illustrate the frequency response curves in three methods for avoiding an output exceeding a protection limit.
Figure 1B:
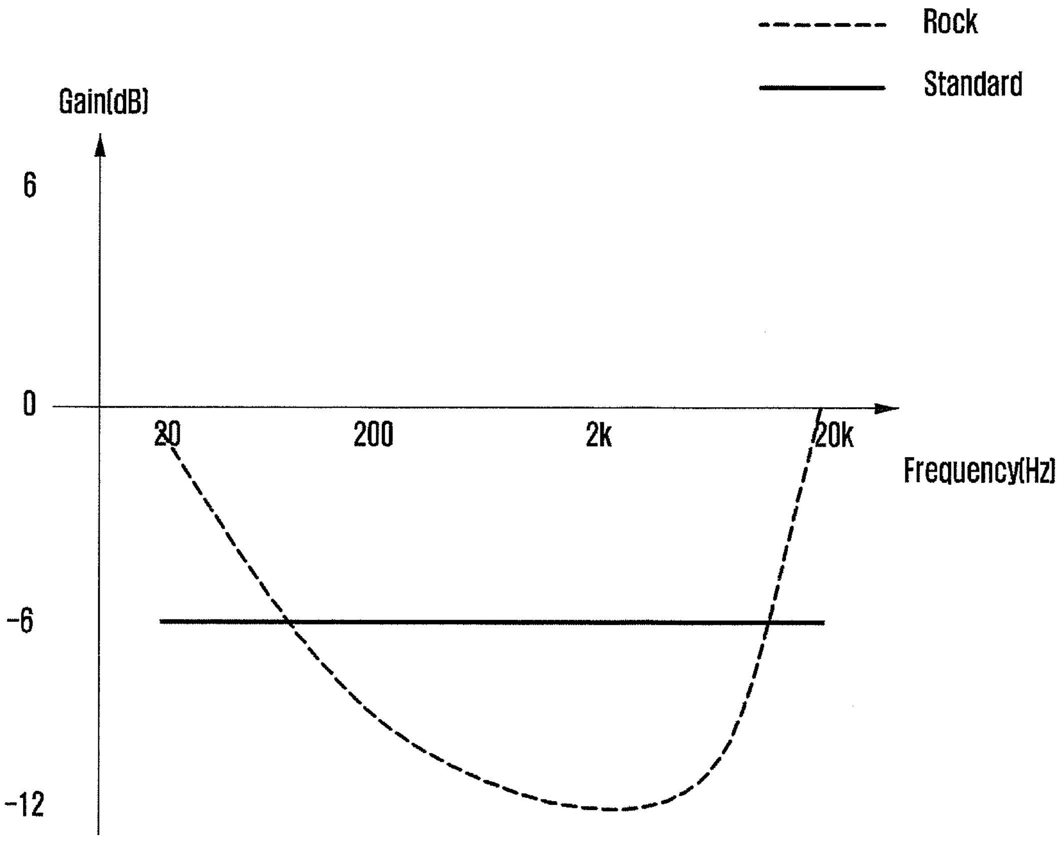
Figure 1C:
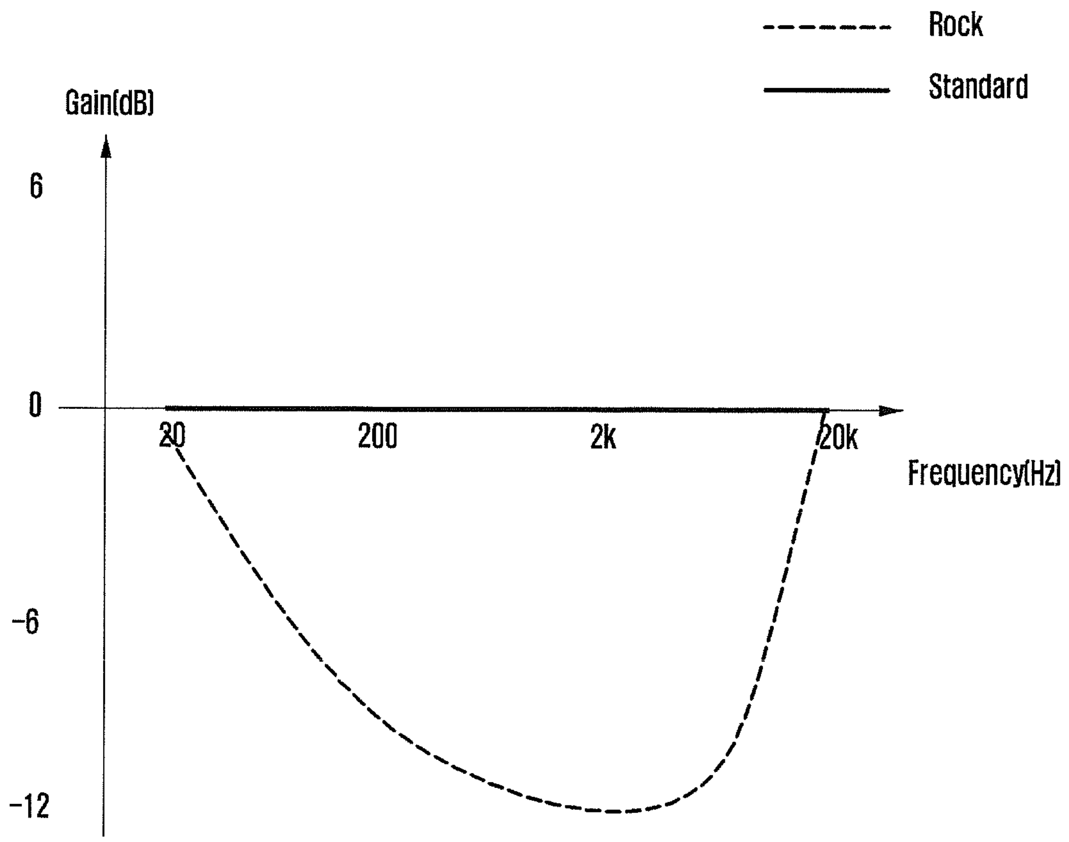

FIGS. 2 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device. Reference will now be made in detail to the embodiments of the present disclosure, examples of which are illustrated in the accompanying drawings, wherein like reference numerals refer to the like elements throughout. The embodiments are described below in order to explain the present disclosure by referring to the figures.

Figure 2:
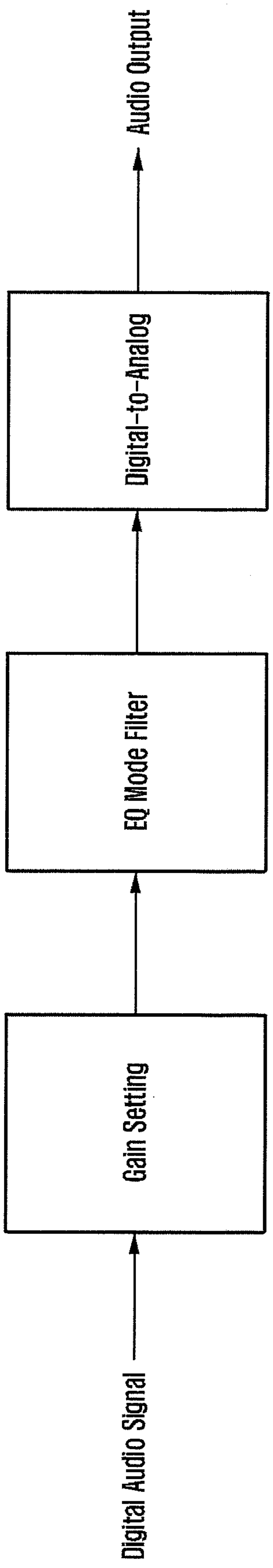
FIG. 2 is a block diagram illustrating an apparatus for performing equalizer mode processing.

FIG. 2 is a block diagram illustrating an apparatus for performing equalizer mode processing.

As shown in FIG. 2, a gain setting unit sets a maximum frequency of an audio signal (e.g., a digital audio signal) which is allowed to pass though the apparatus, an equalizer (EQ) mode filter filters the input audio signal so as to achieve different equalizer modes, and a digital-to-analog converter performs a digital-to-analog conversion on the audio signal in the different equalizer modes output from the EQ mode filter and outputs the analog audio signal. However, the apparatus for performing equalizer mode processing shown in FIG. 2 may exhibit one or more of the shortcomings as described in the Background.

Figure 3:
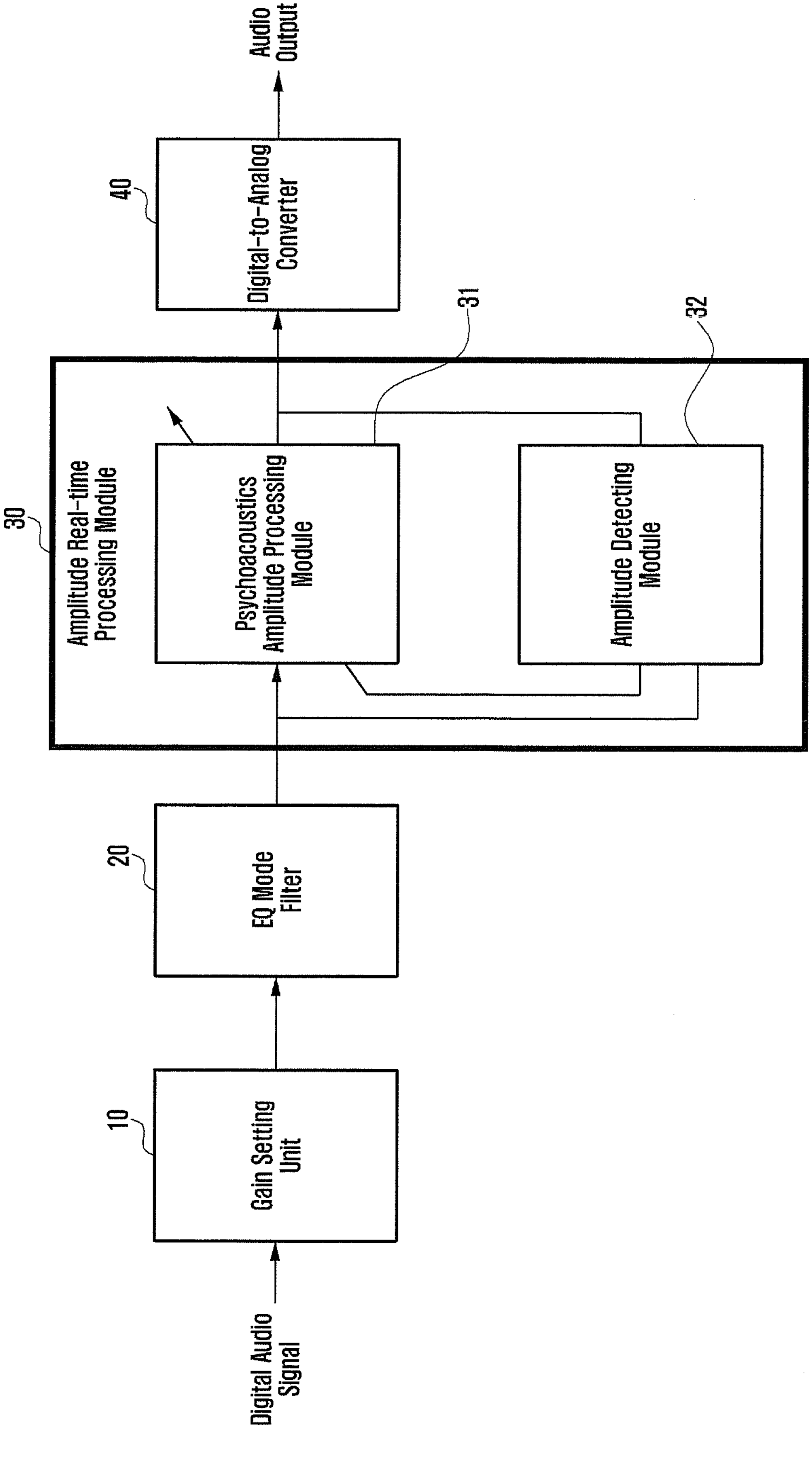
FIG. 3 is a block diagram illustrating an apparatus for keeping output loudness and quality of sound among different equalizer modes according to an embodiment of the present disclosure.

FIG. 3 is a block diagram illustrating an apparatus for keeping output loudness and quality of sound among different equalizer modes according to an embodiment of the present disclosure.

Referring to FIG. 3, the apparatus for keeping output loudness and quality of sound among different equalizer modes comprises a gain setting unit 10, an EQ mode filter 20, an amplitude real-time processing module 30, and a digital-to-analog converter 40. The gain setting unit 10 receives a digital audio signal and sets a protection limit of an output voltage of the input audio signal. The EQ mode filter 20 filters the input audio signal so as to achieve the different equalizer modes. The amplitude real-time processing module 30 receives the audio signal output from the EQ mode filter 20 or an audio signal feedback from itself, and processes the received audio signal so that the output voltage of the processed audio signal is lower than the protection limit. The digital-to-analog converter 40 performs a digital-to-analog conversion on the processed audio signal and outputs an analog audio signal. As shown in FIG. 3, the amplitude real-time processing module 30 comprises a psychoacoustics amplitude processing module 31 and an amplitude detecting module 32. The amplitude detecting module 32 detects a RMS voltage of the received audio signal. The psychoacoustics amplitude processing module 31 selectively performs at least one of a signal straight through processing, a harmonic extraction processing, and an attenuation protection processing on the received audio signal (i.e., the audio signal output from the EQ mode filter 20 or the audio signal feedback by the amplitude real-time processing module 30 itself) according to the RMS voltage detected by the amplitude detecting module 32, so that the output voltage of the processed audio signal is lower the protection limit. Hereinafter, configuration of the psychoacoustics amplitude processing module 31 and the signal straight through processing, the harmonic extraction processing, and the attenuation protection processing performed by the psychoacoustics amplitude processing module 31 will be described in detail with reference to FIG. 4.

Figure 4:
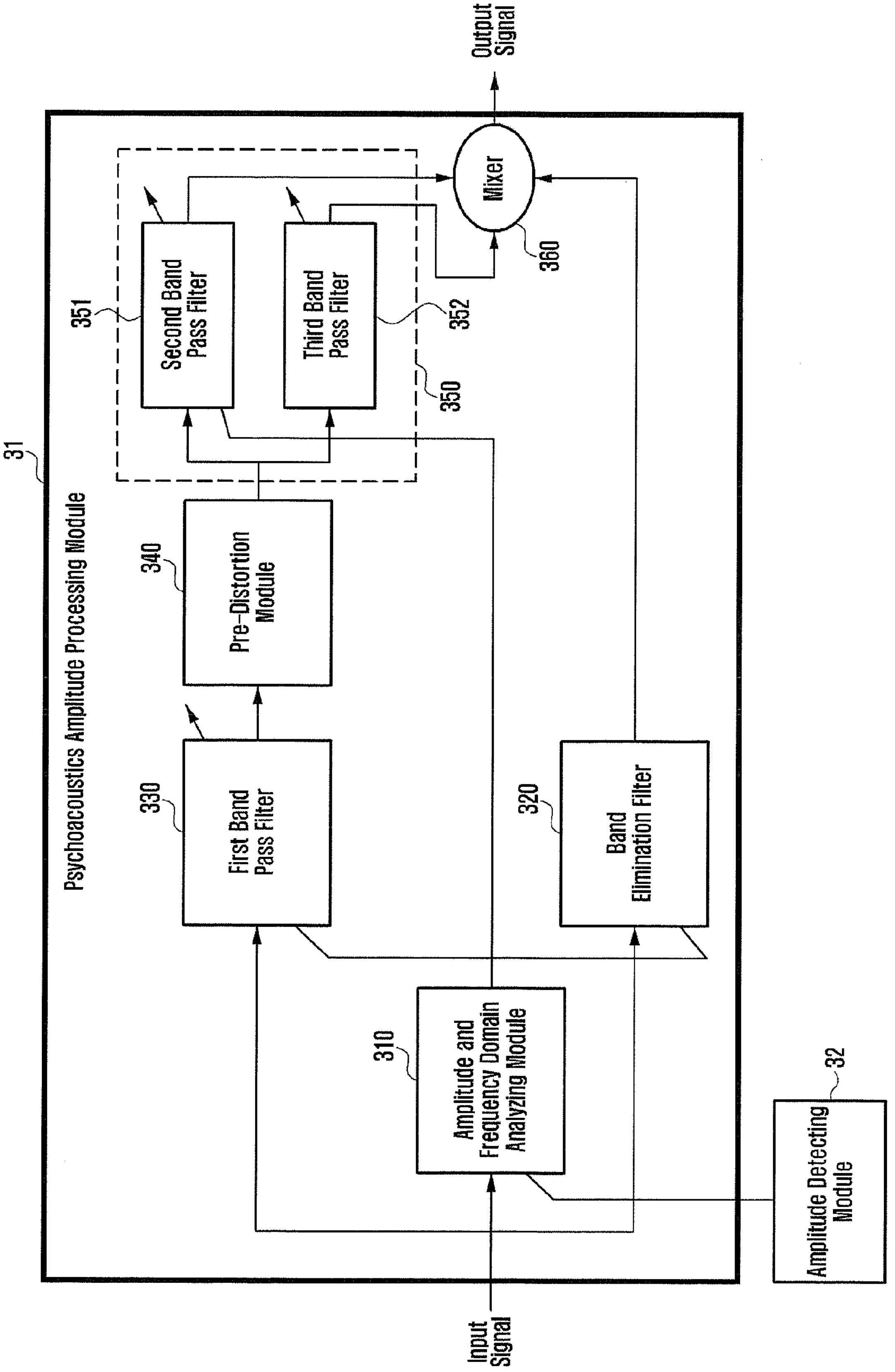
FIG. 4 is a block diagram illustrating a psychoacoustics amplitude processing module included in an amplitude real-time processing module such as illustrated in FIG. 3.

FIG. 4 is a block diagram illustrating the psychoacoustics amplitude processing module 31 included in the amplitude real-time processing module 30 illustrated in FIG. 3.

Referring to FIG. 4, the psychoacoustics amplitude processing module 31 comprises an amplitude and frequency domain analyzing module 310, a band-stop filter 320, a first band pass filter 330, a pre-distortion module 340, a second band pass filter bank 350, and a mixer 360.

The amplitude and frequency domain analyzing module 310 analyzes the received audio signal according to the RMS voltage of the audio signal detected by the amplitude detecting module 32, to determine a frequency band on which energy concentrates. In addition, the amplitude and frequency domain analyzing module 310 also set bandwidth and gain of the band-stop filter 320, the first band pass filter 330, and the second band pass filter bank 350 according to detected the RMS voltage of the audio signal.

The band-stop filter 320 attenuates a specific frequency band of the received audio signal. The first band pass filter 330 allow the specific frequency band of the received audio signal to pass through. The pre-distortion module 340 generates harmonic components of the audio signal output from the first band pass filter 330. The second band pass filter bank 350 extracts second and third harmonics of the audio signal output from the first band pass filter 330. The mixer 360 superposes the audio signal output from the band-stop filter 320 and the audio signal output from the second band pass filter bank 350, and outputs the superposed audio signal.

As shown in FIG. 4, the second band pass filter bank 350 may comprise a second band pass filter 351 and a third band pass filter 352, wherein the second band pass filter 351 extracts the second harmonics of the audio signal output from the pre-distortion module 340, and the third band pass filter 352 extracts the third harmonics of the audio signal output from the pre-distortion module 340.

According to the embodiments of the present disclosure, the pre-distortion module 340 can be achieved in many forms. For example, "Audio Bandwidth Extension-Application of Psychoacoustics, Signal Processing and Loudspeaker Design" drafted by Erik Larsen and Ronald M. Aarts discusses various pre-distortion devices.

When the amplitude detecting module 32 detects that the RMS voltage of the audio signal is higher than the protection limit, the psychoacoustics amplitude processing module 31 performs the harmonics extraction processing. Specifically, when the amplitude and frequency domain analyzing module 310 determines that the RMS voltage of the audio signal detected by the amplitude detecting module 32 is higher than the protection limit, the amplitude and frequency domain analyzing module 310 analyzes the audio signal output from the EQ mode filter 20 to determine the frequency band on which the energy concentrates, and sets the bandwidths (i.e. the bandwidths of the second band pass filter 351 and the third band pass filter 352) of the band-stop filter 320, the first band pass filter 330 and the second band pass filter bank 350 to be the bandwidth of the frequency band on which the energy concentrates. As such, the band-stop filter 320 attenuates the frequency band on which the energy concentrates, the first band pass filter 330 passes the frequency band on which the energy concentrates, the second band pass filter bank 350 extracts the second and third harmonics of the frequency band on which energy concentrates, and the mixer 360 superposes the audio signal output from the band-stop filter 320 and the audio signal output from the second band pass filter bank 350 and outputs the superposed audio signal, so as to perform the harmonics extraction processing.

For example, if the energy of the audio signal concentrates on 800 Hz-1.2 kHz (bandwidth of 400 Hz), a center frequency of the first band pass filter 330 is 1 kHz, a pass band is 800-1.2 kHz, and the bandwidth is 400 Hz. The center frequency of the second harmonics is 2 kHz, the pass band of the corresponding second band pass filter 351 is 1.8 kHz-2.2 kHz, and the bandwidth is 400 Hz. The center frequency of the third harmonics is 3 kHz, the pass band of the corresponding third band pass filter 352 is 2.8 kHz-3.2 kHz, and the bandwidth is 400 Hz. The band-stop filter 320 attenuates 800-1.2 kHz (bandwidth of 400 Hz). Alternatively, gains of the band-stop filter 320, the first band pass filter 330, and the second band pass filter bank 350 all can be set as 0 dB. Alternatively, the gains of the band-stop filter 320, the first band pass filter 330, and the second band pass filter bank 350 can be set in a range of ±6 dB according to actual listening effect.

If the output value of the audio signal on which the harmonics extraction processing has been performed by the psychoacoustics amplitude processing module 31 is still higher than the protection limit, the psychoacoustics amplitude processing module 31 can perform the harmonics extraction processing again on the audio signal. Specifically, after the psychoacoustics amplitude processing module 31 performs the harmonics extraction processing, the amplitude detecting module 32 can detect the RMS voltage of the audio signal on which the harmonics extraction processing has been performed, and feed back the audio signal on which the harmonics extraction processing has been performed to the psychoacoustics amplitude processing module 31. When the amplitude and frequency domain analyzing module 310 determines that the RMS voltage of audio signal on which the harmonics extraction processing has been performed, detected by the amplitude detecting module 32, is higher than the protection limit, the amplitude and frequency domain analyzing module 310 analyzes the feedback audio signal (i.e., the audio signal on which the harmonics extraction processing has been performed) to determine a frequency band on which energy concentrates again and set the bandwidths of the band-stop filter 320, the first band pass filter 330, and the second band pass filter bank 350 to be the bandwidth of the frequency band on which the energy concentrates. The center frequencies of the band-stop filter and the first band pass filter are set as the center frequency of the frequency band on which the energy concentrates, and the center frequency of the second band pass filter bank is set as the frequencies of the second and third harmonics of the frequency band on which the energy concentrates. This is so that the band-stop filter 320 attenuates the frequency band on which the energy concentrates, the first band pass filter 330 passes the frequency band on which the energy concentrates, the second band pass filter bank 350 extracts the second and third harmonics of the frequency band on which the energy concentrates, and the mixer 360 superposes the audio signal output from the band-stop filter 320 and the audio signal output from the second band pass filter bank 350, and outputs the superposed audio signal, thereby performing the harmonics extraction processing again.

After the psychoacoustics amplitude processing module 31 performs the harmonics extraction processing again, the amplitude detecting module 32 can detect the RMS voltage of the audio signal on which the harmonics extraction processing is performed again. If the RMS voltage of the audio signal on which the harmonics extraction processing is performed again is still higher than the protection limit, the psychoacoustics amplitude processing module 31 can perform the attenuation protection processing. Therefore, according to embodiments of the present disclosure, after the harmonics extraction processing is performed twice, if the RMS voltage of the audio signal is still higher than the protection limit, the psychoacoustics amplitude processing module 31 performs the attenuation protection processing. Alternatively, the psychoacoustics amplitude processing module 31 may not perform the harmonics extraction processing again, but perform the attenuation protection processing directly. That is to say, after the harmonics extraction processing is performed once, if the RMS voltage of the audio signal is still higher than the protection limit, the psychoacoustics amplitude processing module 31 may perform the attenuation protection processing. In addition, after the harmonics extraction processing is performed more than two times (e.g. three times), if the RMS voltage of the audio signal is still higher than the protection limit, the psychoacoustics amplitude processing module 31 would perform the attenuation protection processing.

After the harmonics extraction processing is performed twice, when the amplitude detecting module 32 detects that the RMS voltage of the audio signal on which the harmonics extraction processing is performed again is higher than the protection limit, the amplitude detecting module 32 determines an attenuation gain according to the RMS voltage of the audio signal detected before the harmonics extraction processing is performed by the psychoacoustics amplitude processing module 31 and the protection limit. Thereafter, after the amplitude and frequency domain analyzing module 310 receives the attenuation gain determined by the amplitude detecting module 32, the amplitude and frequency domain analyzing module 310 sets gains of the first band pass filter 330 and the second band pass filter bank 350 to be infinitesimal, sets a gain of the band-stop filter 320 to be the attenuation, gain, and allows the audio signal output from the EQ mode filter 20 to pass the first band pass filter 330 in full frequency band, thereby performing the attenuation protection processing. Herein, the gains of the first band pass filter 330 and the second band pass filter bank 350 can be set as infinitesimal by making the coefficients of the first band pass filter 330 and the second band pass filter bank 350 to be zero.

According to embodiments of the present disclosure, when the amplitude detecting module 32 detects that the RMS voltage of the audio signal is lower than the protection limit, the psychoacoustics amplitude processing module 31 would perform the signal straight through processing. That is to say, when the amplitude and frequency domain analyzing module 310 determines that the RMS voltage of the audio signal detected by the amplitude detecting module 32 is lower than the protection limit, the amplitude and frequency domain analyzing module 310 sets the gains of the first band pass filter 330 and the second band pass filter bank 350 to be infinitesimal, sets the gain of the band-stop filter as 0 dB, and allows the audio signal output from the EQ mode filter 20 to pass the band-stop filter in full frequency band, thereby performing the signal straight through processing.

Figure 5:
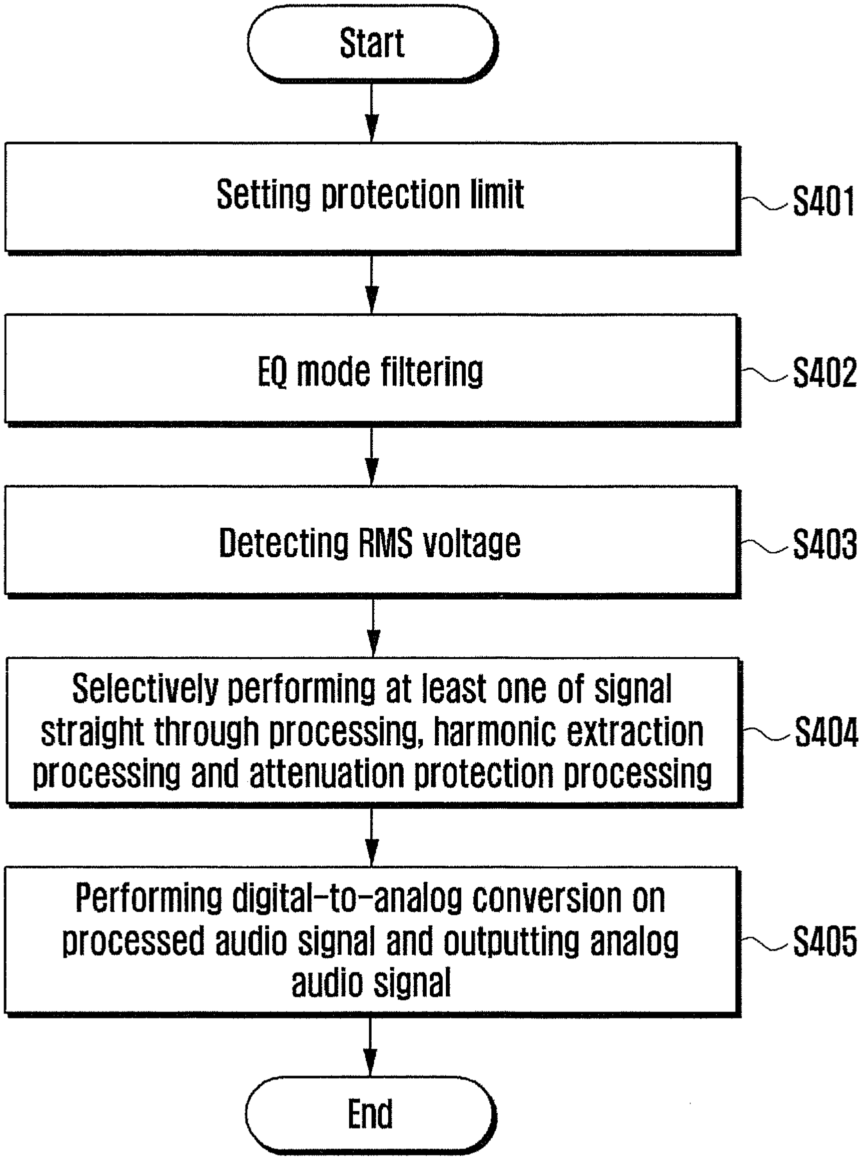
FIG. 5 is a flowchart illustrating a method of keeping output loudness and quality of sound among different equalizer modes according to an embodiment of the present disclosure.

FIG. 5 is a flowchart illustrating a method of keeping output loudness and quality of sound among different equalizer modes according to an embodiment of the present disclosure.

Referring FIG. 5, in operation S401, a protection limit of an output voltage of an input audio signal is set. In operation S402, the input audio signal is filtered so as to achieve the different equalizer modes. In operation S403, a RMS voltage of a received audio signal is detected. In operation S404, at least one of a signal straight through processing, a harmonic extraction processing, and an attenuation protection processing on the received audio signal is selectively performed on the received audio signal according to the detected RMS voltage of the audio signal. In operation S405, a digital-to-analog conversion is performed on the processed audio signal of which output voltage is lower than the protection limit and the analog audio signal is output.

Herein, in operation S403, the received audio signal may be the audio signal filtered at operation S402 or a feedback audio signal processed at operation S404. Operation S404 may comprise the following operations for performing the signal straight through processing, the harmonic extraction processing, and the attenuation protection processing: analyzing the received audio signal to determine a frequency band on which energy concentrates according to the detected RMS voltage of the audio signal; attenuating a specific frequency band of the received audio signal by a band-stop filter; allowing the specific frequency band of the received audio signal to pass a first band pass filter; generating harmonic components of the audio signal output from the first band pass filter; extracting second and third harmonics of the audio signal output from the first band pass filter by a second band pass filter bank; superposing the audio signal output from the band-stop filter and the audio signal output from the second band pass filter bank and outputting the superposed audio signal by a mixer.

In operation S404, when the detected RMS voltage of the audio signal is higher than the protection limit, the filtered audio signal is analyzed. This is to determine the frequency band on which the energy concentrates, and set the bandwidths of the band-stop filter, the first band pass filter, and the second band pass filter bank to be the bandwidth of the frequency band on which the energy concentrates, set the center frequencies of the band-stop filter and the first band pass filter as the center frequency of the frequency band on which the energy concentrates, set the center frequency of the second band pass filter bank 350 as the frequencies of the second and third harmonics of the frequency band on which the energy concentrates, so that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing.

Thereafter, when the detected RMS voltage of audio signal on which the harmonics extraction processing has been performed is higher than the protection limit, the feedback audio signal on which the harmonics extraction processing has been performed is analyzed to determine a frequency band on which energy concentrates again, and set the bandwidths of the band-stop filter, the first band pass filter, and the second band pass filter bank to be the bandwidth of the frequency band on which the energy concentrates, set the center frequencies of the band-stop filter and the first band pass filter as the center frequency of the frequency band on which the energy concentrates, set the center frequency of the second band pass filter bank 350 as the frequencies of the second and third harmonics of the frequency band on which the energy concentrates, so that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing again.

Thereafter, when it is detected that the RMS voltage of the audio signal on which the harmonics extraction processing is performed again is still higher than the protection limit, gains of the first band pass filter and the second band pass filter bank are set to be infinitesimal, a gain of the band-stop filter is set to be the attenuation gain, and the filtered audio signal is allowed to pass the first band pass filter in full frequency band, thereby performing the attenuation protection processing. The attenuation gain may determine according to the RMS voltage of the audio signal detected before the harmonics extraction processing is performed and the protection limit.

Alternatively, in operation S404, when the detected RMS voltage of the audio signal is lower than the protection limit, the gains of the first band pass filter and the second band pass filter bank are set to be infinitesimal, and the gain of the band-stop filter is set as 0 dB, so that the filtered audio signal is allowed to pass the band-stop filter in full frequency band, thereby performing the signal straight through processing.

As described above, by applying an apparatus and method for keeping output loudness and quality of sound in different equalizer modes according to the embodiments of the present disclosure, when an output voltage of an audio signal exceeds a protection limit, an output amplitude would be restricted within the protection limit. The output loudness can be same as that when the amplitude is not restricted by a psychoacoustics amplitude processing, thereby keeping a good SNR and the quality of sound under a noisy environment.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An apparatus for keeping output loudness and quality of sound in different equalizer modes, the apparatus comprising:

a gain setting unit configured to set a protection limit of an output voltage of an input audio signal;

an equalizer (EQ) mode filter configured to filter the input audio signal so as to achieve the different equalizer modes;

an amplitude real-time processing module configured to receive the audio signal output from the EQ mode filter or an audio signal feedback, and process the received audio signal such that the output voltage of the processed audio signal is lower than the protection limit; and a digital-to-analog converter configured to perform a digital-to-analog conversion on the processed audio signal, and output an analog audio signal, wherein the amplitude real-time processing module comprises:

an amplitude detecting module configured to detect an RMS voltage of the received audio signal; and a psychoacoustics amplitude processing module configured to selectively perform at least one of: a signal straight through processing, a harmonic extraction processing, and an attenuation protection processing on the received audio signal according to the detected RMS voltage of the audio signal, such that the output voltage of the processed audio signal is lower the protection limit, wherein the psychoacoustics amplitude processing module comprises:

an amplitude and frequency domain analyzing module configured to analyze the received audio signal according to the RMS voltage of the audio signal detected by the amplitude detecting module, so as to determine a frequency band on which energy concentrates;

a band-stop filter configured to attenuate a specific frequency band of the received audio signal;

a first band pass filter configured to pass the specific frequency band of the received audio signal;

a pre-distortion module configured to generate harmonic components of the audio signal output from the first band pass filter;

a second band pass filter bank configured to extract second and third harmonics of the audio signal output from the first band pass filter; and a mixer configured to superpose the audio signal output from the band-stop filter and the audio signal output from the second band pass filter bank, and output the superposed audio signal.

2. The apparatus of claim 1, wherein the second band pass filter bank comprises a second band pass filter configured to extract the second harmonics of the audio signal output from the first band pass filter, and a third band pass filter configured to extract the third harmonics of the audio signal output from the first band pass filter.

3. The apparatus of claim 1, wherein when the amplitude and frequency domain analyzing module determines that the RMS voltage of the audio signal detected by the amplitude detecting module is higher than the protection limit, the amplitude and frequency domain analyzing module:

analyzes the audio signal output from the EQ mode filter to determine the frequency band on which the energy concentrates, sets the bandwidths of the band-stop filter, the first band pass filter and the second band pass filter bank to be the bandwidth of the frequency band on which the energy concentrates, such that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing by the psychoacoustics amplitude processing module.

4. The apparatus of claim 3, wherein after the psychoacoustics amplitude processing module performs the harmonics extraction processing, the amplitude detecting module detects the RMS voltage of the audio signal on which the harmonics extraction processing has been performed, and feeds back the audio signal on which the harmonics extraction processing has been performed to the psychoacoustics amplitude processing module.

5. The apparatus of claim 4, wherein when the amplitude and frequency domain analyzing module determines that the RMS voltage of audio signal on which the harmonics extraction processing has been performed, detected by the amplitude detecting module, is higher than the protection limit, the amplitude and frequency domain analyzing module:

analyzes the feedback audio signal on which the harmonics extraction processing has been performed to determine a frequency band on which energy concentrates again, and sets the bandwidths of the band-stop filter, the first band pass filter and the second band pass filter bank to be the bandwidth of the frequency band on which the energy concentrates, so that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing by the psychoacoustics amplitude processing module again.

6. The apparatus of claim 5, wherein after the psychoacoustics amplitude processing module performs the harmonics extraction processing again, the amplitude detecting module detects the RMS voltage of the audio signal on which the harmonics extraction processing has been performed again.

7. The apparatus of claim 6, wherein when the amplitude detecting module detects that the RMS voltage of the audio signal on which the harmonics extraction processing has been performed again is higher than the protection limit, the amplitude detecting module determines an attenuation gain according to the RMS voltage of the audio signal detected before the harmonics extraction processing is performed by the psychoacoustics amplitude processing module and the protection limit.

8. The apparatus of claim 7, wherein when the amplitude and frequency domain analyzing module receives the attenuation gain determined by the amplitude detecting module, the amplitude and frequency domain analyzing module sets gains of the first band pass filter and the second band pass filter bank to be infinitesimal, sets a gain of the band-stop filter to be the attenuation gain, and allows the audio signal output from the EQ mode filter to pass the first band pass filter in full frequency band, thereby performing the attenuation protection processing by the psychoacoustics amplitude processing module.

9. The apparatus of claim 1, wherein when the amplitude and frequency domain analyzing module determines that the RMS voltage of the audio signal detected by the amplitude detecting module is lower than the protection limit, the amplitude and frequency domain analyzing module sets the gains of the first band pass filter and the second band pass filter bank to be infinitesimal, sets the gain of the band-stop filter as 0 dB, and allows the audio signal output from the EQ mode filter to pass the band-stop filter in full frequency band, thereby performing the signal straight through processing by the psychoacoustics amplitude processing module.

10. A method for keeping output loudness and quality of sound in different equalizer modes, the method comprising:

(a) setting a protection limit of an output voltage of an input audio signal;

(b) filtering the input audio signal so as to achieve the different equalizer modes;

(c) processing a received audio signal such that the output voltage of the processed audio signal is lower than the protection limit; and (d) performing a digital-to-analog conversion on the processed audio signal, and outputting an analog audio signal, wherein the processed audio signal is feedback, so that the received audio signal is the filtered audio signal or the feedback processed audio signal in operation (c), wherein operation (c) comprises:

detecting an RMS voltage of the received audio signal; and selectively performing at least one of: a signal straight through processing, a harmonic extraction processing, and an attenuation protection processing on the received audio signal according to the detected RMS voltage of the audio signal, such that the output voltage of the processed audio signal is lower than the protection limit, wherein the selectively performing comprises:

analyzing the received audio signal according to the RMS voltage of the audio signal detected by an amplitude detecting module, so as to determine a frequency band on which energy concentrates;

attenuating a specific frequency band of the received audio signal;

passing, by a first band pass filter, the specific frequency band of the received audio signal;

generating, by a pre-distortion module, harmonic components of the audio signal output from the first band pass filter;

extracting, by a second band pass filter bank, second and third harmonics of the audio signal output from the first band pass filter; and superimposing, by a mixer, the audio signal output from the band-stop filter and the audio signal output from the second band pass filter bank, and outputting the superposed audio signal.

11. The method of claim 10, wherein the second band pass filter bank comprises a second band pass filter configured to extract the second harmonics of the audio signal output from the first band pass filter, and a third band pass filter configured to extract the third harmonics of the audio signal output from the first band pass filter.

12. An apparatus for keeping output loudness and quality of sound in different equalizer modes, comprising:

a gain setting unit configured to receive a digital audio signal and set a protection limit of an output voltage of the digital audio signal;

an equalizer (EQ) mode filter configured to filter the digital audio signal so as to achieve the different equalizer modes;

an amplitude real-time processing module configured to receive the audio signal output from the EQ mode filter or an audio signal feedback, and process the received audio signal such that the output voltage of the processed audio signal is lower than the protection limit; and a digital-to-analog converter configured to perform a digital-to-analog conversion on the processed audio signal, and output an analog audio signal, wherein the amplitude real-time processing module comprises:

an amplitude detecting module configured to detect an RMS voltage of the received audio signal; and a psychoacoustics amplitude processing module configured to selectively perform at least one of: a signal straight through processing, a harmonic extraction processing, and an attenuation protection processing on the received audio signal according to the detected RMS voltage of the audio signal, such that the output voltage of the processed audio signal is lower the protection limit, wherein the psychoacoustics amplitude processing module comprises:

an amplitude and frequency domain analyzing module configured to analyze the received audio signal according to the RMS voltage of the audio signal detected by the amplitude detecting module, so as to determine a frequency band on which energy concentrates;

a band-stop filter configured to attenuate a specific frequency band of the received audio signal;

a first band pass filter configured to pass the specific frequency band of the received audio signal;

a pre-distortion module configured to generate harmonic components of the audio signal output from the first band pass filter;

a second band pass filter bank configured to extract second and third harmonics of the audio signal output from the first band pass filter; and a mixer configured to superpose the audio signal output from the band-stop filter and the audio signal output from the second band pass filter bank, and output the superposed audio signal.

13. The apparatus of claim 12, wherein the second band pass filter bank comprises a second band pass filter configured to extract the second harmonics of the audio signal output from the first band pass filter, and a third band pass filter configured to extract the third harmonics of the audio signal output from the first band pass filter.

14. The apparatus of claim 12, wherein when the amplitude and frequency domain analyzing module determines that the RMS voltage of the audio signal detected by the amplitude detecting module is higher than the protection limit, the amplitude and frequency domain analyzing module:

analyzes the audio signal output from the EQ mode filter to determine the frequency band on which the energy concentrates, sets the bandwidths of the band-stop filter, the first band pass filter and the second band pass filter bank to be the bandwidth of the frequency band on which the energy concentrates, such that the band-stop filter attenuates the frequency band on which the energy concentrates, the first band pass filter passes the frequency band on which the energy concentrates, the second band pass filter bank extracts the second and third harmonics of the frequency band on which the energy concentrates, and the mixer superposes the audio signal output from the band-stop filter and the audio signal output from the second band pass filter bank, and outputs the superposed audio signal, thereby performing the harmonics extraction processing by the psychoacoustics amplitude processing module.

* * * * *